US006937967B2

(12) United States Patent
Hines et al.

(10) Patent No.: US 6,937,967 B2
(45) Date of Patent: Aug. 30, 2005

(54) METHOD AND SYSTEM FOR FINITE ELEMENT MODELING AND SIMULATION OF ENHANCED MAGNETORESISTANCE IN THIN FILM SEMICONDUCTORS WITH METALLIC INCLUSIONS

(75) Inventors: Daniel R. Hines, Lawrenceville, NJ (US); Stuart A. Solin, Princeton Junction, NJ (US); Tao Zhou, Plainsboro, NJ (US); Jonathan E. Moussa, Webster, MA (US); Lakshminarayanapuram Ramdas Ram-Mohan, Northborough, MA (US); John M. Sullivan, Jr., Worcester, MA (US)

(73) Assignee: TDK Corporation, Tokyo (JP)

( * ) Notice: Subject to any disclaimer, the term of this patent is extended or adjusted under 35 U.S.C. 154(b) by 697 days.

(21) Appl. No.: 09/796,304

(22) Filed: Feb. 28, 2001

(65) Prior Publication Data

US 2002/0173941 A1 Nov. 21, 2002

(51) Int. Cl.$^7$ ............................ G06F 7/60; G06F 17/10; G06F 101/00
(52) U.S. Cl. ............................... 703/2; 703/1; 703/22; 257/421
(58) Field of Search .......................... 703/1–2, 13–22; 257/421

(56) References Cited

U.S. PATENT DOCUMENTS

| 5,965,283 | A  |   | 10/1999 | Solin et al. |
| 6,504,363 | B1 | * | 1/2003  | Dogaru et al. ............... 324/235 |
| 6,707,122 | B1 | * | 3/2004  | Hines et al. ................. 257/421 |

FOREIGN PATENT DOCUMENTS

| EP | 950-871 A2  | 10/1999 |
| WO | WO 01/41214 | 6/2001  |

OTHER PUBLICATIONS

Peterson, "Computing at the Edge," Science News, vol. 155, pp. 232–234 (Apr. 1999).*
Imamura et al, "An FEM Analysis of the Temperature Rise Distribution in a GMR Head Due to the Sense Current and Contact Resistance," IEEE Transactions on Magnetics, vol. 35 No. 5, pp. 2559–2561 (Sep. 1999).*
Benbouzid et al, "Finite Element Modelling of the Magnetostrictive Devices: Investigations for the Design of the Magnetic Circuit," IEEE Transactions on Magnetics, vol. 31 No. 3, pp. 1813–1816 (May 1995).*
Brauer et al, "Finite Element Analysis of Hall Effect and Magnetoresistance," IEEE Transactions on Electron Devices, vol. 42 No. 2, pp. 328–333 (Feb. 1995).*
Solin, S.A. et al., "Enhanced Room–Temperature Geometric Magnetoresistance in Inhomogeneous narrow–Gap Semiconductors," Science, vol. 289, pp. 1530–1532, Sep. 2000.
Solin, S.A. et al., "Extraordinary Magnetoresistance in Inhomogeneous Non–magnetic High–mobility Semiconductors," Proceedings of the 25th International Conference on Physics of Semiconductors, Japan, pp. 177 1–1774, 2000.
Zhou, T. et al., "Extraordinary Magnetoresistance in Externally Shunted van der Pauw Plates," Applied Physics Letters, vol. 78, No. 5, pp. 667–669, Jan. 2001.

(Continued)

*Primary Examiner*—Samuel Broda
(74) *Attorney, Agent, or Firm*—Scully, Scott, Murphy & Presser

(57) ABSTRACT

This invention relates to a method and system for finite element modeling of enhanced magnetoresistance in thin film semiconductors containing at least one metallic inclusion therein. The method and system utilizes finite element analysis techniques as a function of the applied magnetic field and the geometry of the device for comparing the device characteristics with predetermined qualities and modifying the device to achieve a correlation between the device characteristics and the predetermined qualities.

7 Claims, 11 Drawing Sheets

OTHER PUBLICATIONS

Wolfe, C.M. et al., "Anomalously High 'Mobility' in Semiconductors," Applied Physics Letters, vol. 18, No. 5, pp. 205–208, 1971.

Wolfe, C.M. et al., "High Apparent Mobility in Inhomogeneous Semiconductors," Journal of Electrochem Society, vol. 119, No. 2, pp. 250–255, 1972.

Wolfe, C.M. et al., "Apparent Mobility Enhancement in Inhomogeneous Crystals," Semiconductors and Semimetals, vol. 10, edited by Willardson, R.K. and Beer, A.C., Academic Press, NY, Chapter 3, pp. 175–220, 1975.

Zawadski, W., "Electron Transport Phenomena in Small-gap Semiconductors," Advances in Physics, pp. 435–522, 1974.

Ram–Mohan, L.R. et al., "The Finite–element Method for Energy Elgenvalues of Quantum Mechanical Systems," Computers in Physics, pp. 50–59, 1990.

Popovic, R.S., *Hall Effect Devices*, Adam Hilger, Bristol, pp. 156–165, 236–241, 1991.

Press, W.H. et al., *Numerical Recipes in C*, Cambridge University Press, pp. 43–50, 1992.

Sullivan, J.M., "Automated Mesh Generation for Simulations Exhibiting Extreme Geometric Change," Proceedings of the 3rd International Conference on CAD/CAM Robotics and Factories of the Future, vol. 1, pp. 6 1–64, 1988.

Zienkiewicz, O.C. et al., *The Finite Element Method*, Fourth Edition, McGraw–Hill, pp. 1–20, 1994.

Hughes, T.J., *The Finite Element Method*, Prentice–Hall, Inc., pp. 57–108, 1987.

Courant, R. et al., *Methods of Mathematical Physics*, Wiley–Interscience, pp. 208–215, 1953.

Experimental study of the validity of simple design rules for the biasing of spin–valve–type GMR heads, Wiep Folkerts et al., Sensors and Actuators, , 1998, pp. 237–240.

Zheng, Yuankai et al., "3–D FEM Micromagnetic Modeling of Spin–Valve Sensors", IEEE Transactions on Magnetics (2000), vol. 36, No. 5, pp. 3158–3160.

\* cited by examiner

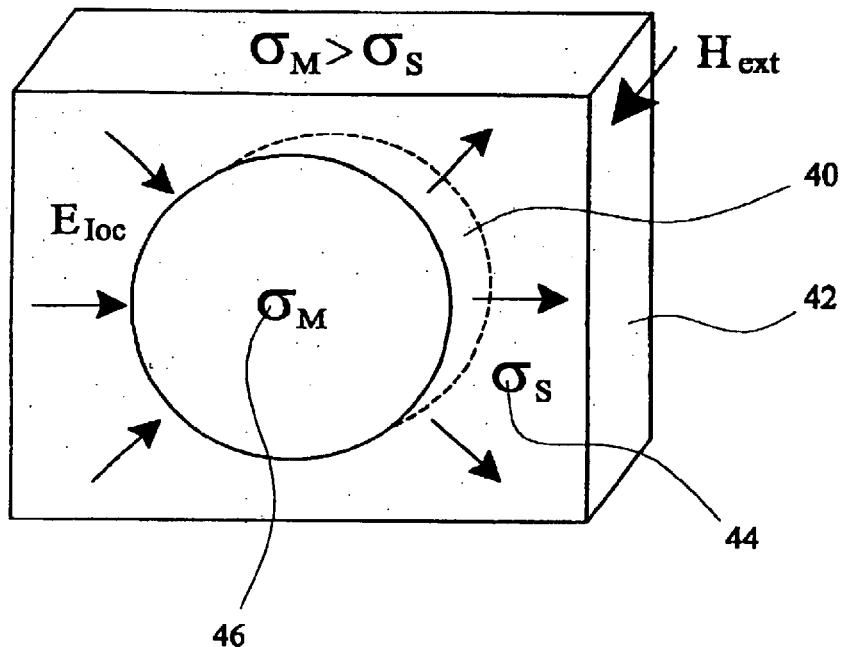
(a)
Low Field $\beta \ll 1$
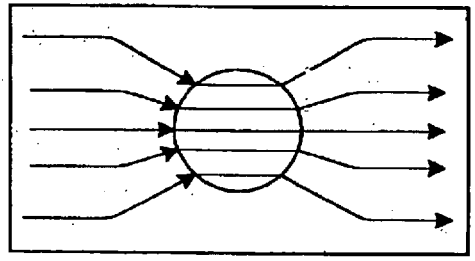
Short Circuit
$j \parallel E$
(b)
High Field $\beta \gg 1$
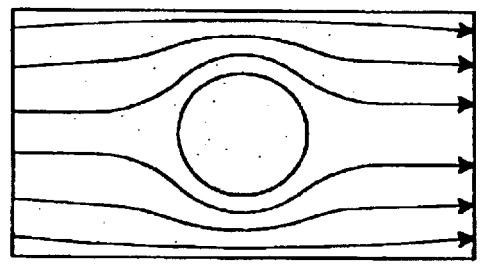
Open Circuit
$j \perp E$
(c)
FIG. 3

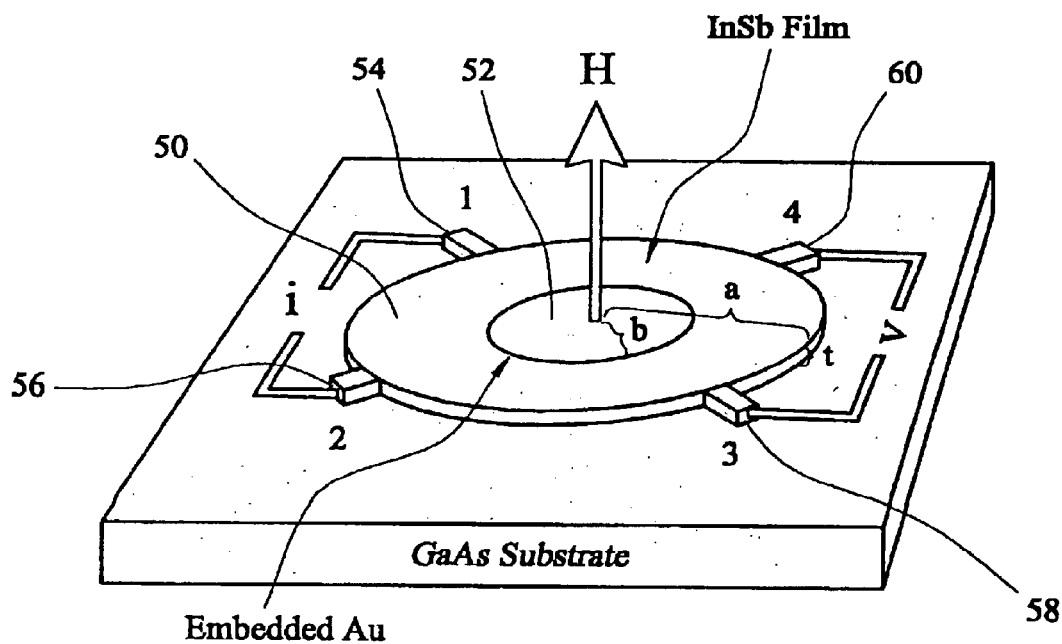
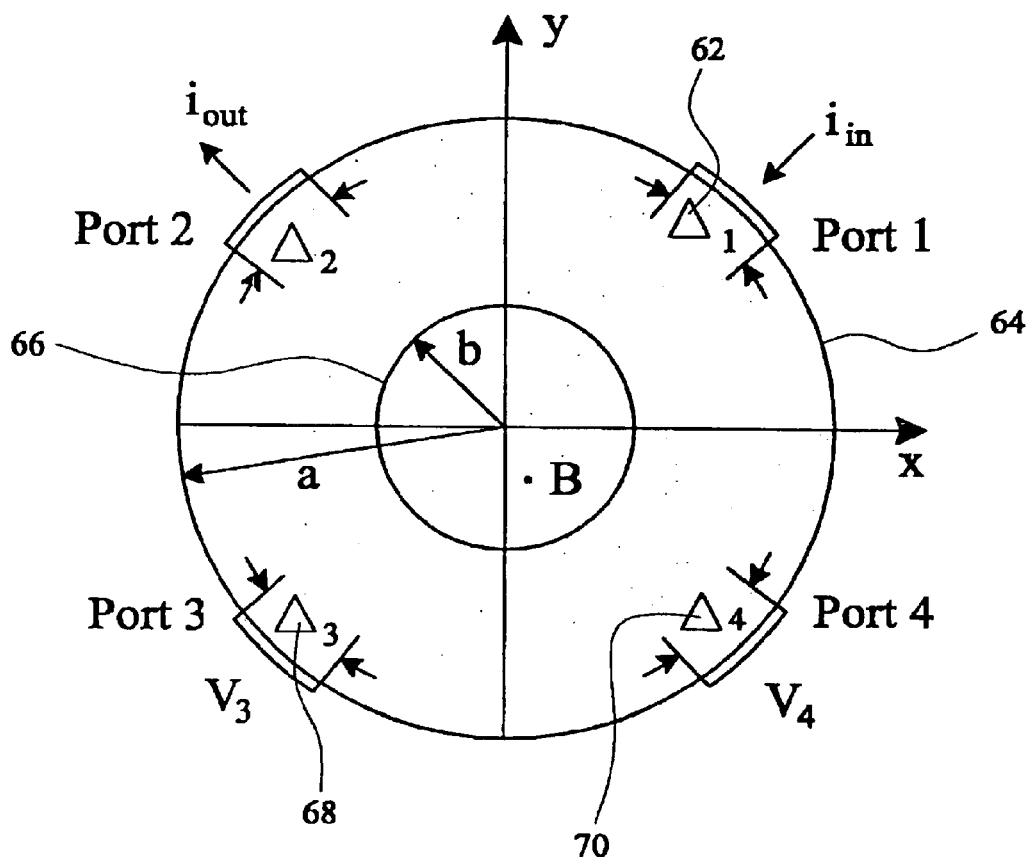
FIG. 4

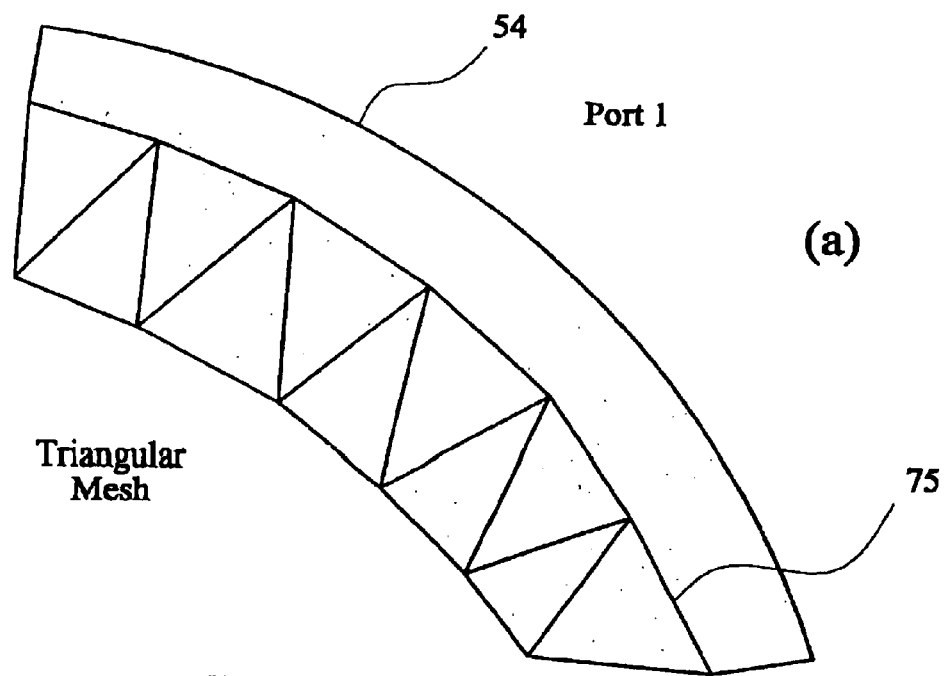
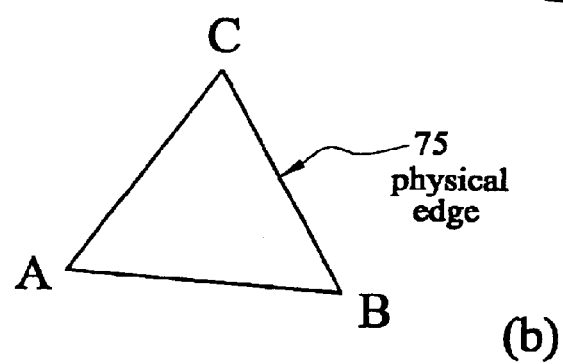
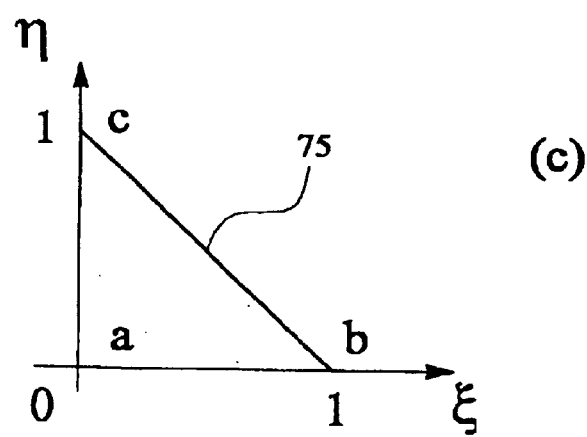
FIG. 6

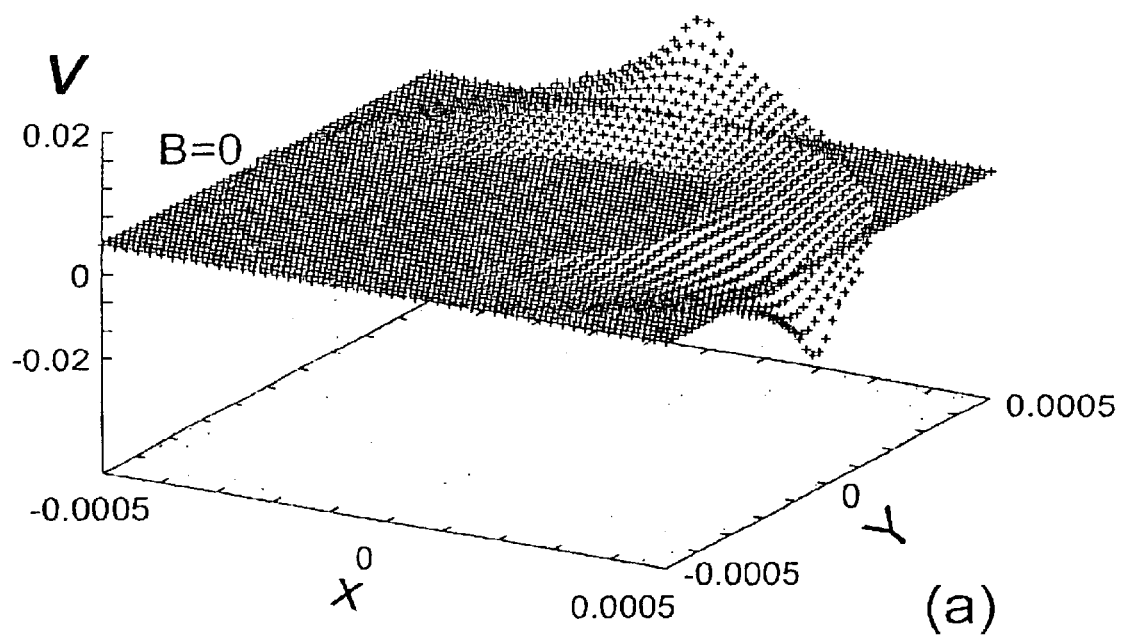
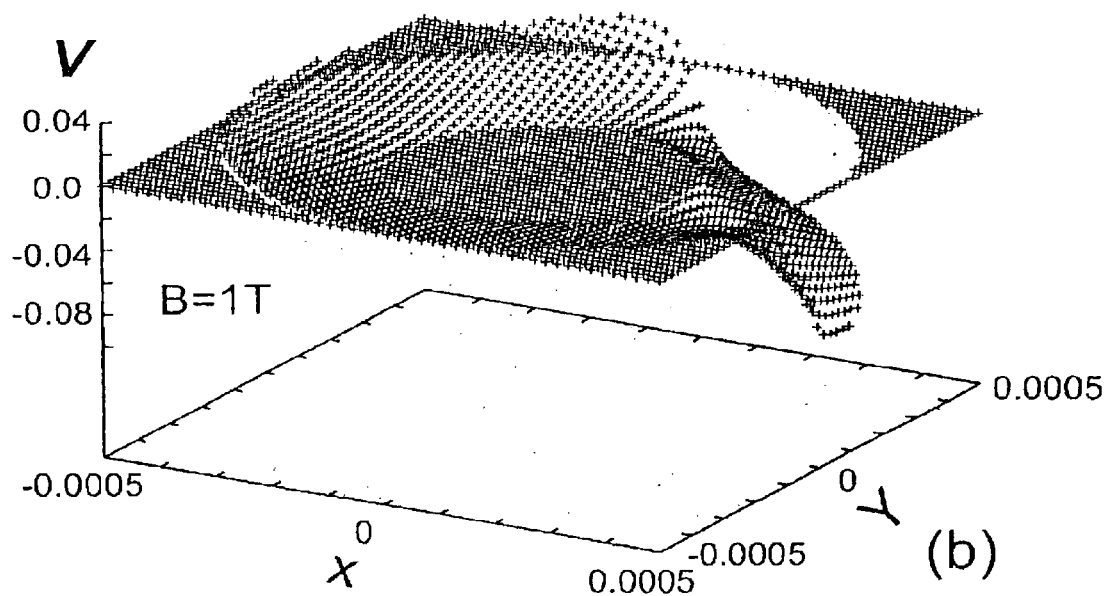
FIG. 9

Material parameters used in calculations.

| | Conductivity (300K) $\sigma\,(\Omega\,m)^{-1}$ | Mobility $\mu$ $(m^2/V\cdot sec)$ | Carrier Conc. $n\,(m^{-3})$ | Collision Time $\tau\,(sec)$ | Effective Mass $m^*/m_0$ | Fermi Level $E_F\,(eV)$ |
|---|---|---|---|---|---|---|
| InSb | $1.865 \cdot 10^4$ | 4.55 | $2.55 \cdot 10^{22}$ | $3.87 \cdot 10^{-13}$ | 0.015 | |
| Au | $4.52 \cdot 10^7$ | $5.5 \cdot 10^{-3}$ | $5.90 \cdot 10^{28}$ | $3.0 \cdot 10^{-14}$ | 1.0 | 5.51 |
| Cu | $5.88 \cdot 10^7$ | $3.34 \cdot 10^{-3}$ | $8.45 \cdot 10^{28}$ | $1.9 \cdot 10^{-14}$ | 1.0 | 7.0 |

FIG. 11

METHOD AND SYSTEM FOR FINITE ELEMENT MODELING AND SIMULATION OF ENHANCED MAGNETORESISTANCE IN THIN FILM SEMICONDUCTORS WITH METALLIC INCLUSIONS

FIELD OF THE INVENTION

This invention generally relates to extraordinary magnetoresistance (EMR) in inhomogeneous semiconductors. Specifically, this invention relates to a method and system for finite element modeling of enhanced magnetoresistance in thin film semiconductors with metallic inclusions.

BACKGROUND OF THE INVENTION

Semiconductor thin films with metallic inclusions display extraordinary magnetoresistance (EMR) at room temperature, with enhancements as high as 100%–750,000% at magnetic fields ranging from 0.05 to 4 Tesla. The magnetoresistance (MR) is defined as MR=[R(H)–R(0)]/R (0), where R(H) is the resistance at finite field, H. These enhancements have been shown on a composite van der Pauw disk of a semiconductor matrix with an embedded metallic circular inhomogeneity that was concentric with the semiconductor disk and for a rectangular semiconductor wafer with a metallic shunt on one side.

Magnetic materials and artificially layered metals exhibit giant magnetoresistance (GMR) and manganite perovskites show colossal magnetoresistance (CMR). However, patterned non-magnetic InSb shows a much larger geometrically enhanced extraordinary MR (EMR) even at room temperature.

In FIG. 1(a), the typical Hall bar configuration 10 is shown. In an applied magnetic field 14 the electrons have a circular trajectory around the lines of the magnetic field, as displayed in FIG. 1(b). As soon as the current begins to flow, the space charge accumulation on one side gives rise to a (Hall) electric field $E_y$ 20 which is measured by the voltage difference across the Hall bar, the Hall voltage. If one assumes only one type of carrier with a delta-function velocity distribution, the force on the carriers from the Hall field cancels the Lorentz force and the direct current $j_x$ 22 continues to remain the same, as indicated in FIG. 1(c). There is then no magnetic field dependence of the resistance in this case, e.g. the MR, $\Delta\rho/\rho_0=0$ where $\rho$ is the resistivity and $\rho_0$ is the zero field resistivity.

In the Corbino disk, illustrated in FIG. 2, there are two concentric contacts 30 with the current entering at the inner contact and exiting at the outer contact. In the presence of a magnetic field 36 perpendicular to the Corbino disk the electron trajectories 34 follow circular paths and the resistance is a function of the magnetic field. Moreover, because the conducting electrodes are in this case equipotential surfaces, no space charge accumulates on them and no Hall voltage is developed. Since there is no Hall field to produce a force that competes with the Lorentz force there can be a large MR, which in this case is $\Delta\rho/\rho_0=(\mu H)^2$ where $\mu$ is the carrier mobility and H is the applied magnetic field. The geometric differences in the standard Hall geometry and the Corbino geometry yield a significant field dependence of the resistance in the latter.

In the presence of metallic inhomogeneities narrow-gap semiconductors show marked enhancement of the MR. Because of their small carrier masses the narrow gap high mobility semiconductors such as InSb and HgCdTe are the preferred materials to consider.

Narrow gap semiconductors (NGS) are preferable since such materials have a high phonon-limited room-temperature carrier mobility, $\mu_{300}$. For instance, for bulk InSb $\mu_{300}$=7.8 m$^2$/Vs, while for InAs (indium arsenide) $\mu_{300}$=3 m$^2$/Vs[10]. An additional advantage of NGS is its low Schottky barrier (W. Zawadzki, "Electron transport phenomena in small-gap semiconductors", Adv. Phys. 23, 435–522 (1974)). This feature avoids the depletion of carriers in the semiconductor by the artificially-structured metallic inclusions and ensures good electrical contacts.

InSb is a favored material because of its higher mobility. However there is a problem associated with the growth of thin films of this material. InSb by itself cannot be used as a substrate in a magnetic sensor because of its very large parallel conductance. No other III-V binary compound or group IV substrate is lattice matched to InSb. Therefore GaAs (gallium arsenide) (lattice mismatch is 14%) is usually employed for reasons of cost and convenience.

Other possible materials include, but are not limited to, Si, GaAs, HgCd, Hg$_{1-x}$Cd$_x$Te, InSb, InSbTe, InAs, InAsSb as single layered material or multi-layered material or a material from a mixture made of these materials. However, it is understood that any comparable material can be used.

Shown in FIG. 3(a) is a cylindrical metal (Au) 40 embedded within a semiconducting slab 42. The conductivities of the semiconductor and the metal are $\sigma_S$ 44 and $\sigma_M$ 46, respectively, in the absence of a magnetic field. In low magnetic fields, the current flowing through the material is focused into metallic regions with the metal acting as a short circuit; the current density, j, is parallel to the local electric field $E_{loc}$ as indicated in FIG. 3(b). For $\sigma_M>>\sigma_S$ the surface of the metal is essentially an equipotential. Thus $E_{loc}$ is normal to the interface between the metal and semiconductor.

At finite magnetic field, the current deflection due to the Lorentz force results in a directional difference between j and $E_{loc}$, the angle between them being the Hall angle. For sufficiently high fields the Hall angle approaches 90° in which case j is parallel to the semiconductor-metal interface and the current is deflected around the metal which acts like an open circuit as indicated in FIG. 3(c). The transition of the metal from a short circuit at low field to an open circuit at high field gives rise to the very large MR or EMR.

Under steady state conditions the problem of determining the current and the field in the inhomogeneous semiconductor reduces to the solution of Laplace's equation for the electrostatic potential. For some simple structures this problem can be solved analytically. In general, however, the location and material properties of the inhomogeneities can be altered and the semiconducting material can be shaped to enhance the MR. In order to have this freedom to explore the geometrical enhancement of the MR in the device and to be able to consider semiconductor films and metallic inclusions/shunts of arbitrary shape, a numerical approach to the simulation of the enhanced MR is required.

SUMMARY OF THE INVENTION

Since extraordinary magnetoresistance (EMR) can be geometrically enhanced, it is useful to have methods to model and design such structures for preferred performance traits. This invention allows for modeling of geometrically complex heterostructures for improvements in the performance of EMR-based magnetic devices before they are fabricated for electronic applications.

The invention calculates and models EMR using finite element analysis techniques as a function of the applied magnetic field and the size/geometry of the inhomogeneity. Other properties such as the field-dependence of the current flow and of the potential on the disk periphery can also be modeled by the invention.

As an example, the EMR for a modified van der Pauw disk of InSb with a concentric embedded Au inhomogeneity has been calculated without using adjustable parameters. FIG.(8) shows the flow lines of the current. The arrows indicate the direction of current flow at B=0 in FIG. 8(a) and at B=1T in FIG. 8(b). The lengths of the arrows are not to scale in the figure. The effect of the applied magnetic field on the current deflection at the interface between the semiconductor and the inhomogeneity can be readily seen from the figure. The large perturbation to the potential at the current ports caused by the applied field as shown in FIG. 9 for the two cases B=0 in FIG. 9(a) and B=1T in FIG. 9(b) for a value of $\alpha$=0.5 indicates that the EMR is very sensitive to the position and width of the voltage ports. Indeed, for the modified van der Pauw structure addressed here, the output voltage, $\Delta V_{mn}(H, \alpha)$ decreases as the EMR is increased by the selection of the voltage and current port locations. The current through the structure provides the driving terms in the set of simultaneous equations obtained from the variational principle applied to the discretized action. The finite element approach is able to capture the important dependence of the response of the structure to the geometrical placement and location of the current ports.

The action integral formulation of the finite element analysis is able to apply the current (derivative) boundary conditions directly in specific sections of the boundary, i.e. at the current ports, while allowing the values of the potential at other segments of the periphery to be self-consistently determined from the variation of the discretized action integral. The values of the potential at all the nodes located just at the voltage-measuring ports are equated to each other since the voltage is the same across the leads. This is implemented by "folding in", or adding together, of columns of the global matrix generated in the finite element method that correspond to the nodes at the voltage ports. Such details of the boundary conditions can be accounted for with ease within the framework of the finite element method.

A preferred method uses a bandwidth reducer and sparse matrix LU-solvers to substantially reduce the computer time for the calculations.

The true flexibility and power of this method comes into its own when the physical semiconductor film is not only of arbitrary shape but contains both filled (conducting) and empty (insulating) embedded inhomogeneities of arbitrary shape as shown schematically in FIG. 10.

This ability to model such structures with these characteristics enables the design and manufacture of improved EMR-based sensors and devices.

BRIEF DESCRIPTION OF THE DRAWINGS

FIG. 3 is an illustration of EMR as a function of the magnetic field.

FIG. 4 displays a circular van der Pauw geometry.

FIG. 6 illustrates the triangular meshing.

FIG. 9 illustrates the potential distribution in the van der Pauw geometry.

FIG. 11 illustrates the material parameters used in the calculations.

DETAILED DESCRIPTION OF THE PREFERRED EMBODIMENTS

Figure 1:
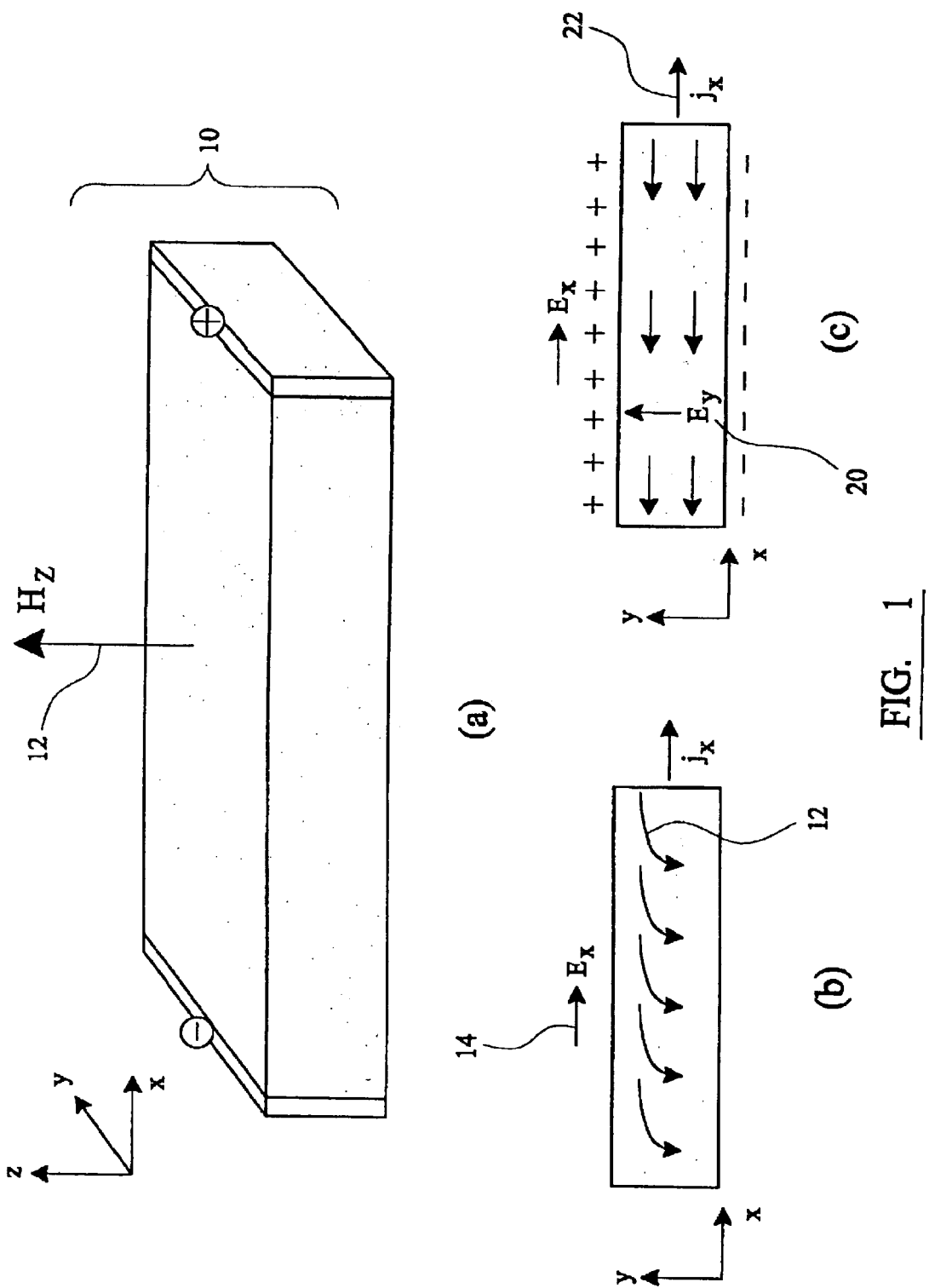
FIG. 1 is an illustration of the Hall configuration.

FIG. 1 is an illustration of the Hall bar configuration: the electron trajectories 12 in a rectangular sample, shown in FIG. 1(a), bend in a magnetic field 14 so that negative charges accumulate at the edge of the xy-plane, as shown in FIG. 1(b). In the steady state, shown in FIG. 1(c), this leads to an electric field $E_y$20, the Hall field, perpendicular to the longitudinal direction in which the current $j_x$22 is flowing. This does not give a magnetic field dependent conductivity.

Figure 2:
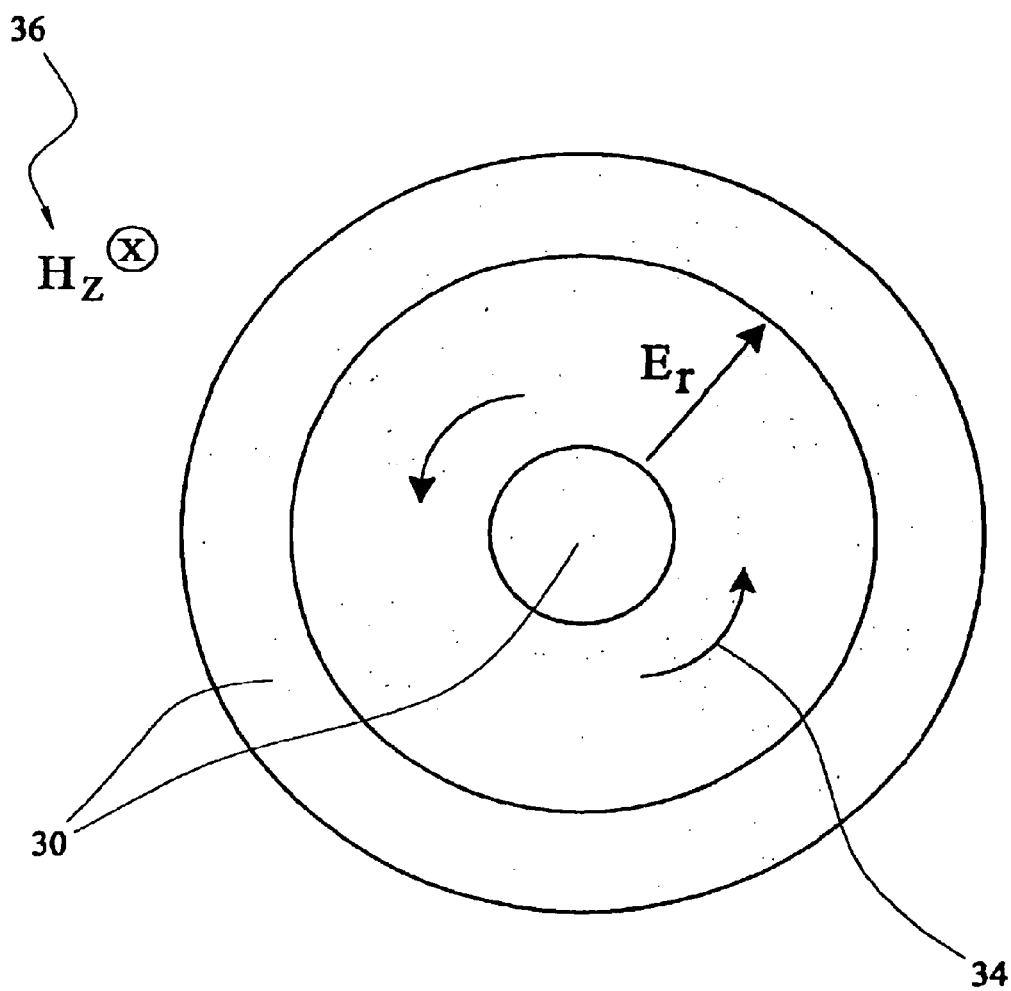
FIG. 2 is an illustration of the Corbino geometry.

In the Corbino geometry shown in FIG. 2, the electrodes 30 are concentric with a circular current 34 flowing in the absence of a magnetic field. With a magnetic field 36 present, the electron drift velocity is in the tangential (to the circular region) direction. This leads to a magnetic field dependent conductivity that is geometry dependent. The magnetoresistance $\Delta\rho/\rho_0$ is proportional to $H^2$ at low field.

In FIG. 3(a) the extraordinary magnetoresistance (EMR) is manifested by the effect on the boundary conditions at the metal 40-semiconductor 42 interface as a function of the magnetic field H sub ext. FIG. 3(b) shows at low magnetic fields ($\beta$<<1), the current density j is parallel to the electric field E and the metal acts as a short circuit. FIG. 3(c) demonstrates at high fields, ($\beta$>>1), j is perpendicular to the electric field E and the system acts as an open circuit.

FIG. 4 shows, as an example, a circular disk 50 of InSb of thickness t containing a concentric disk of Au 52, with four contacts (ports), attached symmetrically to the periphery of the semiconductor. This configuration is called the modified van der Pauw geometry. The disk 50 of InSb has a radius $a$ while the Au inclusion 52 has a radius b, with the ratio of the radii denoted by $\alpha$=b/a. A current enters port 1 (54) and exits via port 2 (56). The response of the semiconducting disk is measured by the voltage difference between ports 3 (58) and 4 (60). The widths of the ports have been labeled as $\Delta_1$ 62. The disk geometry reduces the problem to a two-dimensional one.

The constitutive relation between the current j and the electric field E in the presence of an external magnetic field H along the z-axis is given by $j_i=\sigma_{ij}(H)E_j$ with $$\beta=\mu H \quad (3)$$

where $\mu$ is again the mobility of the carriers as noted above. The conductivity is given by $$\sigma(0) = \frac{ne^2\tau}{m^*} = ne\mu \quad (4)$$

where n is the carrier density, m* is the effective mass, e is the electronic charge and $\tau$ is the collision time.

In the steady state, we have $$\frac{\partial}{\partial x_i} j_i = 0. \quad (5)$$

With $E_l=-\partial_l\phi$, the electrostatic potential $\phi(x,y)$ satisfies the differential equation $$\partial_i(\sigma_{ij}\partial_j\phi(x,y))=0 \qquad (6)$$

The boundary conditions at the outer edge of the disk at radius r=a are:

(a) At Port 1:

$$(\vec{j}\cdot\hat{n}) = -J_{in} = -\frac{I_{in}}{\Delta_1 t}. \qquad (7)$$

(b) At Port 2:

$$(\vec{j}\cdot\hat{n}) = +J_{out} = \frac{I_{out}}{\Delta_2 t}. \qquad (8)$$

Here, $I_{in}=I_{out}$, from current conservation. The quantities $J_{in}$ and $J_{out}$ are positive and their signs have been entered explicitly in the above.

(c) At Ports 3 (58), 4 (60): we have $\phi=V_3$ and $\phi=V_4$, respectively, where these potentials have to be determined by the above calculations. The entire width of each port is considered to be at the same voltage.

(d) Along the rest of the semiconductor disk's 64 edge we set j=0 along the periphery.

(e) Finally, along the metal-semiconductor interface at r=b 66 the radial currents are equal. Hence we have $$[\sigma_{ij}^{(1)}\partial_j\phi(r=b)](\hat{n}_r)_1=[\rho_{ij}^{(2)}\partial_j\phi(r=b)](\hat{n}_r)_1, \qquad (9)$$

or $$(\vec{j}\cdot\hat{n}_r)|_{r=b^-}=(\vec{j}\cdot\hat{n}_r)|_{r=b^+} \qquad (10)$$

Here the material index on the conductivity tensor refers to the semiconductor 50 (index=1) and to the metal 52 (index=2).

Rather than directly solving Eq. (6), we begin by setting up the action integral that gives rise to it. This is done in order that we may employ the finite element method. The action integral is given by $$A = \frac{1}{2}\int\int dx dy (\partial_i\phi(x,y))\sigma_{ij}(\partial_j\phi(x,y)) + \int_{\Delta_1} dl[\phi(x,y)]\Big|_{\Delta_1} j_{in} - \int_{\Delta_2} dl[\phi(x,y)]\Big|_{\Delta_2} j_{out}. \qquad (11)$$

The double integral in Eq. (11) is just the electrostatic energy in the system. It is instructive to apply the principle of least action to the above equation in order to verify that the variation of the action with respect to the potential function indeed rep8roduces Eq. (6). Setting the variation of A with respect to the potential function $\phi(x,y)$ to zero we obtain $$\delta A = 0 = \qquad (12)$$
$$\left[-\int\int dx dy \delta\phi\{\partial_i\sigma_{ij}(\partial_j\phi(x,y))\} + \int_{\Gamma(r=a)} dl\delta\phi\hat{n}\cdot(\sigma_{ij}(\partial_j\phi))\right] + \int_{\Delta_1} dl\delta\phi j_{in} - \int_{\Delta_2} dl\delta\phi j_{out}.$$

An integration by parts has been performed in order to obtain the terms in the square brackets. The variations $\delta\phi$ are arbitrary. We therefore choose them as follows.

(i) Choose variations such that $\delta\phi=0$ on the periphery r=a. We then obtain the differential equation, Eq. (6), from the double integral in Eq. (12).

(ii) Now let $\delta\phi=0$ inside the physical region and also along the periphery 64 except at the input port along $\Delta_1$ where it is chosen to be 1. Then $\delta A=0$ requires $$\int_{\Delta_1} dl(j_{in} + \hat{n}\cdot\vec{j}) = 0.$$

In other words, we have $(\hat{n}\cdot\vec{j})_{\Delta_1}=-j_{in}$. This is just Eq. (7).

(iii) Next, choose $\delta\phi=1$ along $\Delta_2$ and zero elsewhere. Then $$\int_{\Delta_2} dl(-j_{out} + \hat{n}\cdot\vec{j}) = 0.$$

implying that $(\hat{n}\cdot\vec{j})_{\Delta_2}=j_{out}$, as in Eq. (8).

(iv) Finally, put $\delta\phi0$ in the interior and along $\Delta_1$ and $\Delta_2$. Then $\delta A=0$ requires that $(\hat{n}\cdot\vec{j})_{r=a}=0$ on the rest of the circular periphery of the semiconductor.

The starting action integral with the surface terms for the currents, through the principle of least action, leads to the original differential equations with its boundary conditions including the "derivative" boundary conditions on the input and output currents. The invention employs the above action in numerical modeling.

Figure 5:
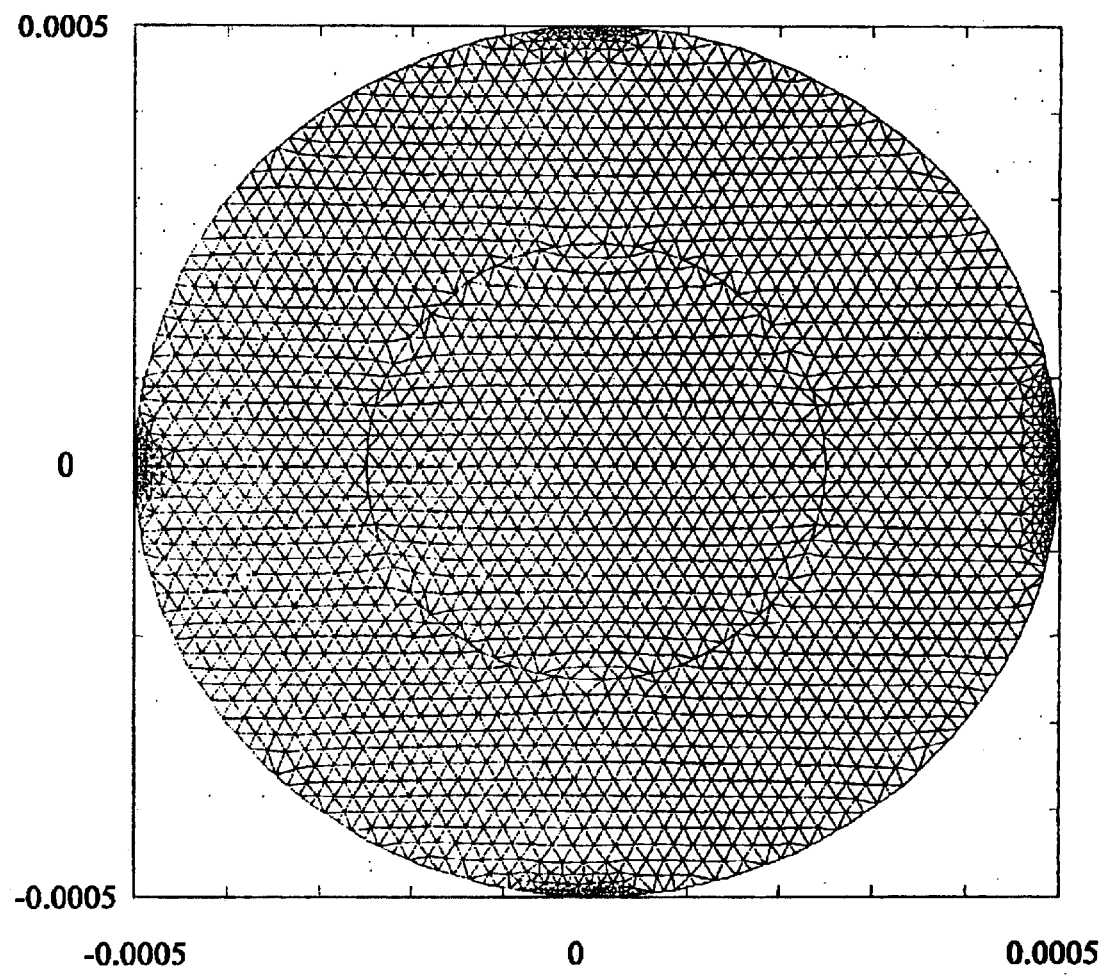
FIG. 5 illustrates the discretization of the physical region for $\alpha$=b/a=8/16.

The method begins by discretizing the action integral itself. The physical region is separated into triangles, or elements, in each of which the physics of the problem holds. This discretization is performed using an unstructured triangular mesh that is generated by the so-called algebraic integer method. The result of this meshing is shown in FIG. 5. FIG. 5 illustrates the discretization of the physical region for $\alpha=b/a=8/16$ The mesh has been made finer in the vicinity of the ports (contacts). In each of the triangular elements the function $\phi(x,y)$ is represented in terms of local interpolation polynomials $N_i(x,y)$. Each triangle has either three nodes, located at the three vertices of the triangle, or six nodes located at the midpoints of the sides of the triangle and at the vertices.

Let $$\phi(x,y) = \sum_i \phi_i N_i(x,y), \qquad (13)$$

where $N_i$ are unity at node i. The interpolation polynomials are linear for the 3-nodal triangle, and quadratic polynomials in x and y in the case of a 6-nodal triangle. Using the above functional form in the action integral the spatial dependence is integrated out and the action in each element (i.e., Eq. (11) limited to the elemental area) is expressed in the form $$A^{(ielem)} = \frac{1}{2}\phi_i M_{ij}^{(ielem)}\phi_j \qquad (14)$$

Next, for continuity at the nodes, all the contributions from each element are added by setting the nodal values to be the same for all triangles having a common node. This amounts to an overlay of each element matrix $M_y^{ielem}$ into a global matrix such that the nodal contributions from all triangles having that node in common are added. It is then obtained $$A = \frac{1}{2}\phi_\alpha M_{\alpha\beta}\phi_\beta + \int_{\Delta_1} dl[\phi(x,y)]\bigg|_{\Delta_1} j_{in} - \int_{\Delta_2} dl[\phi(x,y)]\bigg|_{\Delta_2} j_{out}. \quad (15)$$

The integrals in Eq. (15), that may be designated as "surface" terms, need further elaboration. If one assumes a constant linear current density across the port the surface terms are readily evaluated as follows. In FIG. 6(a), the edge of the physical region along port 1 (54) is shown. One must integrate along the port in order to evaluate the first contour integral in Eq. (15). Consider one of the triangles with one edge 75 coinciding with the contour at port 1 (54). The physical edge is along the side BC of the triangle ABC of FIG. 6(b). We map this on to a "standard" right-angled triangle abc of FIG. 6(c). If side BC corresponds to side ab of the standard triangle, we have $$\int_B^C dl\phi(x,y)j_{in} = j_{in} \int_a^b d\xi \frac{dl}{d\xi} \sum_i \phi_i N_i(\xi, 0) = \frac{1}{2}l(\phi_C + \phi_B)j_{in}. \quad (16)$$

Here l is the length of the edge BC. The same result obtains if the side BC corresponds to the side ac of the standard triangle. In the case where the side BC corresponds to the hypotenuse bc of the standard triangle we obtain $$\int_B^C dl\phi(x,y)j_{in} = j_{in} \int_b^c d\lambda \frac{dl}{d\lambda} \sum_i \phi_i N_i(\xi, \eta = 1-\xi). \quad (17)$$

Here $$d\lambda = \sqrt{(d\xi)^2 + (d\eta)^2} = d\xi\sqrt{1 + \left(\frac{d}{d\xi}(1-\xi)\right)^2} = \sqrt{2}\,d\xi$$

and $$\frac{dl}{d\lambda} = \frac{l}{\sqrt{2}},$$

so that again Eq. (17) reduces to the right side of Eq. (16). The above calculations can be performed for quadratic interpolation functions when these are employed in representing the potential over each triangle. Thus an expression for the discretized action is given by $$A = \frac{1}{2}\phi_\alpha M_{\alpha\beta}\phi_\phi + j_{in}\left[\sum_{\substack{edge\\sides\\on\,\Delta_1}} l_i\left\{\frac{1}{6}\phi_1^{(i)} + \frac{2}{3}\phi_2^{(i)} + \frac{1}{6}\phi_3^{(i)}\right\}\right] - \quad (18)$$

$$j_{out}\left[\sum_{\substack{edge\\sides\\on\,\Delta_2}} l_i\left\{\frac{1}{6}\phi_1^{(i)} + \frac{2}{3}\phi_2^{(i)} + \frac{1}{6}\phi_3^{(i)}\right\}\right]$$

Now the inventions variational principle is implemented by varying the discretized action A of Eq. (18) with respect to the nodal variables $\phi_\alpha$. One obtains $$\frac{\delta A}{\delta\phi_\alpha} = 0 = M_{\alpha\beta}\phi_\beta + C_i j_{in}\delta_{i\alpha} - C_j j_{out}\delta_{j\alpha}. \quad (19)$$

Here $C_i$ and $C_j$ are constants determined by evaluating the surface terms as described above. One then has a set of simultaneous equations for the nodal variables $\phi_\alpha$.

Due to the connectivity of the triangular mesh the resulting coefficient matrix is sparsely occupied. It is preferred that a bandwidth reduction of the matrix is performed and then it is decomposed into the standard LU form for Gauss elimination.

The invention also equates all the nodal values for nodes appearing in ports 3 (58) and 4 (60) in order to define a unique potential at the ports over the lengths $\Delta_3$ 68 and $\Delta_4$ 70. Since no absolute potential values are set in the problem, the invention assigns one of the ports to have zero potential with respect to which all other potentials are measured. The solution of the simultaneous equations provides a unique solution.

The principle quantity of interest is the field and geometry dependence of the effective resistance $R_{mn}(H, \alpha)=[\Delta V_{mn}(H, \alpha)]/i$ where $\Delta V_{mn}(H, \alpha)=V_m(H, \alpha)-V_n(H, \alpha)$, n and m define the voltage ports, i is a constant current and as before $\alpha=b/a$ [see FIGS. 4(a) and (b)]. Once the effective resistance is known, the EMR can be readily determined from $$EMR_{mn}(H, \alpha) = \left(\frac{R_{mn}(H, \alpha) - R_{mn}(0, \alpha)}{R_{mn}(0, \alpha)}\right) \quad (20)$$

Figure 7A:
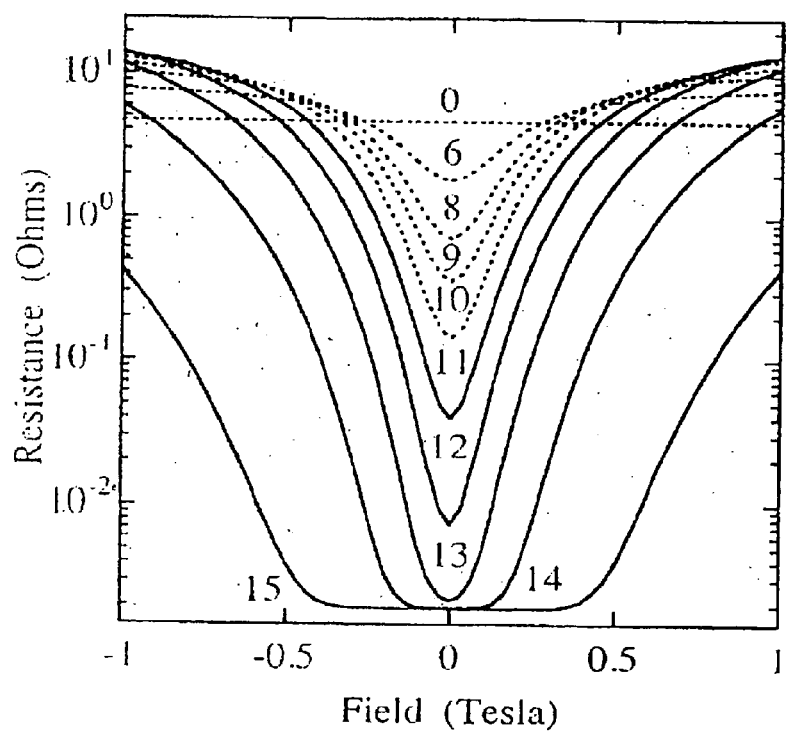
FIG. 7 is a plot of the magnetoresistance as a function of the magnetic field for $\alpha'$=16(b/a) ranging from 0 to 15 as obtained from (a) calculations and (b) directly from experiments.

The effective resistance, $R_{mn}(H, \alpha)$, is plotted in FIG. 7(a) using the parameters for InSb and Au specified in FIG. 11 (with values for Cu shown for reference) corresponding to experimental measurements to be described below. Thus the influence of the metallic inhomogeneity is determined by varying the radius of the inner metallic region 52 to change the ratio $\alpha$.

Note that for $\alpha > 13/16$, $R_{mn}(H, \alpha)$ is very small and field-independent up to an onset field above which it increases very rapidly. This diode-like behavior may offer the opportunity for employing such constructs as a magnetic switch. The physical origin of this diode effect is understood: for a sufficiently large conducting inhomogeneity, deflected current will only flow in the correspondingly small annular ring of semiconductor when the field exceeds a critical value. Below that value the current is completely shunted by the inhomogeneity and its path through the semiconductor from the input to the output ports provides a negligible contribution to the resistance.

Figure 7B:
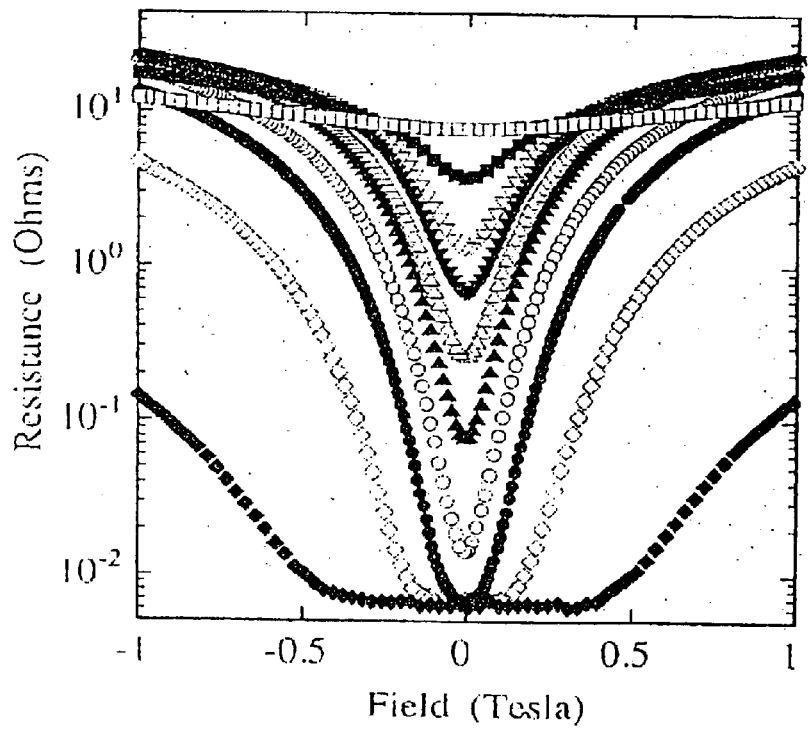

The calculations of $R_{mn}(H, \alpha)$ described above are compared with the corresponding experimental results shown in FIG. 7(b). Those experimental results were obtained from a composite van der Pauw disk of InSb with an embedded Au inhomogeneity. The slight shift in the relative values of the abscissae in FIGS. 7(a) and (b) is probably due to a finite contact resistance between the metal inhomogeneity and the semiconductor which has not been included in the calculation. Moreover, one can notice that the calculated effective resistance for $\alpha=0$ is totally field independent whereas the corresponding experimental result shows a slight field dependence. This difference results from the fact that the physical contribution to the effective resistance from the field dependence of the intrinsic parameters such as the mobility and carrier concentration is small but finite and has not been included in the calculated results.

Figure 8:
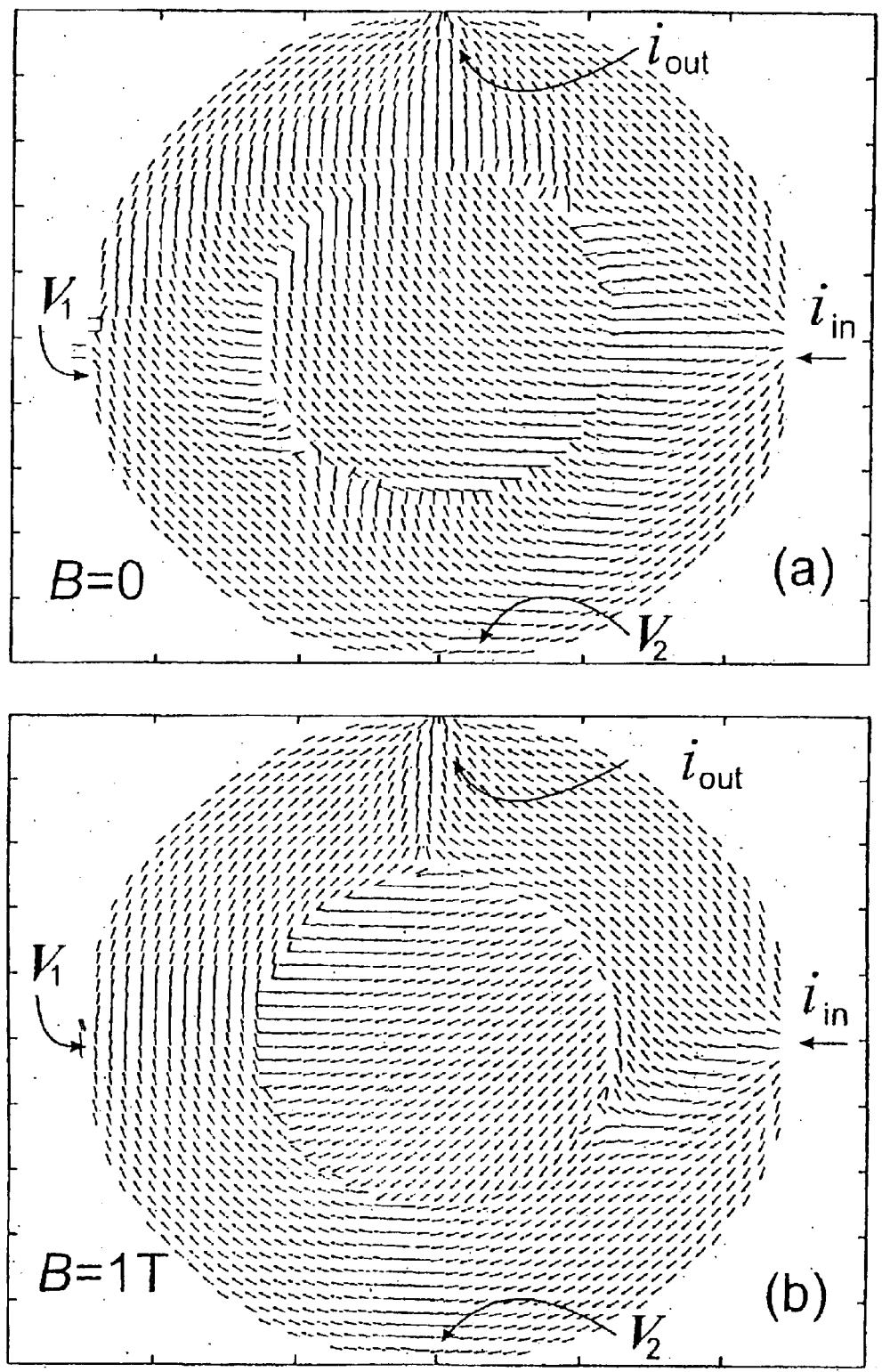
FIG. 8 illustrates the current flow in the van der Pauw geometry.

FIG. 8 illustrates the current flow in the van der Pauw geometry for a circular InSb wafer with a concentric metallic inhomogeneity and α'=16(b/a)=8, in FIG. 8(a) at B=0 and in FIG. 8(b) at B=1 Tesla. The lengths of the arrows are not to scale.

FIG. 9 illustrates the potential distribution in the van der Pauw geometry for a steady state current through ports 1 (54) and 2 (56). FIG. 9(a) shows the current in the absence of a an applied magnetic field and FIG. 9(b) shows the current at an applied magnetic field of B=1 Tesla.

Figure 10:
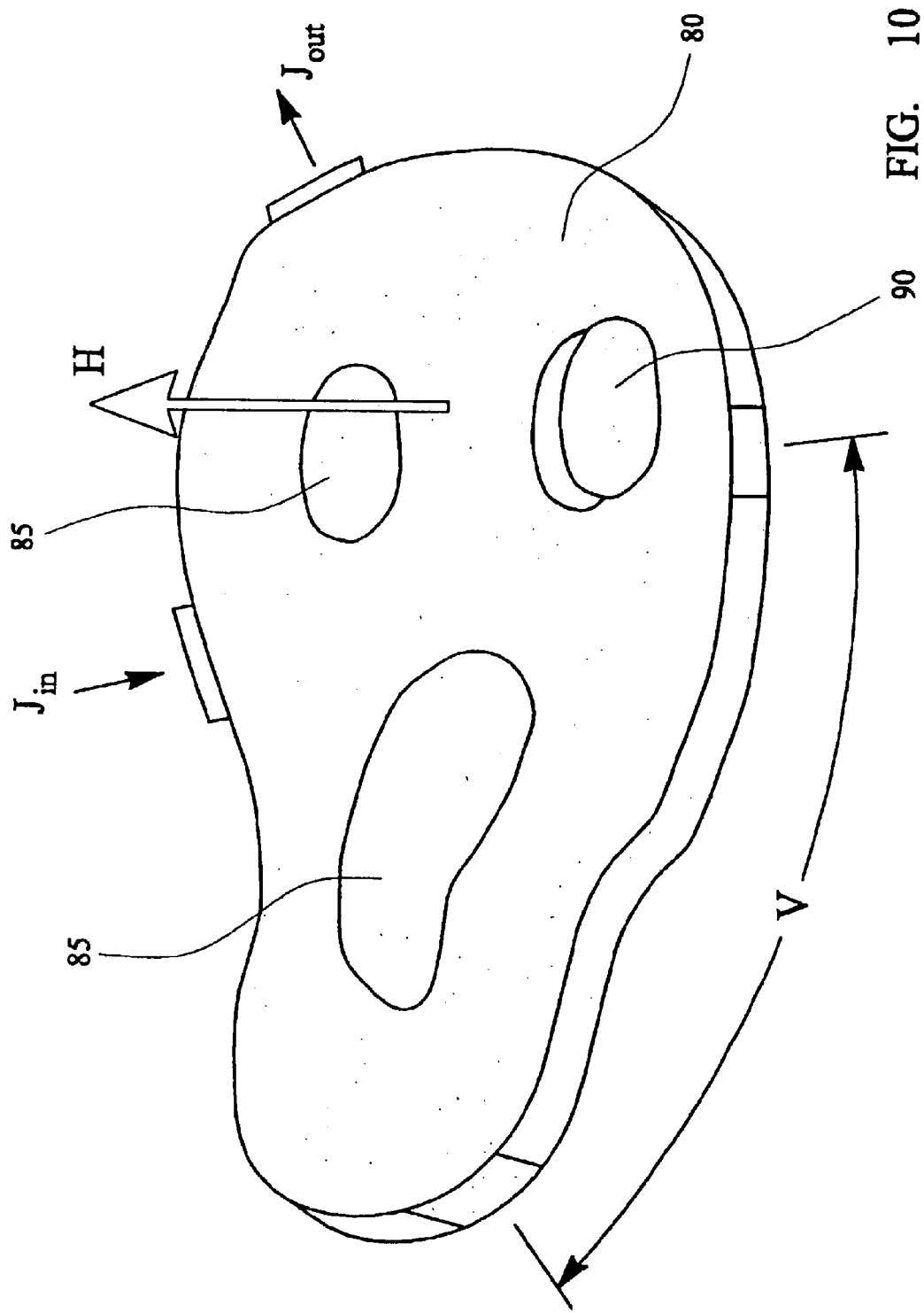
FIG. 10 illustrates the four-contact van der Pauw geometry for an arbitrarily shaped InSb thin film with distributed metallic inclusions of arbitrary shape and with a hole in it of arbitrary shape.

FIG. 10 illustrates the four-contact van der Pauw geometry for an arbitrarily shaped InSb thin film 80 with distributed metallic inclusions 85 of arbitrary shape and with a hole 90 in the film of arbitrary shape.

FIG. 11 illustrates the material parameters of the materials used in the calculations.

While much of the above description refers to a modified van der Pauw geometry, the invention is equally applicable to any arbitrary shape. In addition, the metallic inclusions can be, but are not limited to, Si, Fe, Cr, Ni, GaAs, InAs, InAsSb, Au, Ag, Cu, Mo, W, Y, Ti, Zr, Hf, V, Nb, Pt, or Ta as a single layer film or multi-layered film or a film made from a mixture of these materials. It is understood that any comparable material can be used.

Accordingly, it should be readily appreciated that the method and system for finite element modeling of enhanced magnetoresistance of the present invention has many practical applications. Additionally, although the preferred embodiment has been illustrated and described, it will be obvious to those skilled in the art that various modifications can be made without departing from the spirit and scope of this invention. Such modifications are to be considered as included in the following claims unless the claims expressly recite differently.

What is claimed is:

1. A method for optimizing the design of a semiconductor thin film device with at least one metallic inclusion therein, the device having a plurality of current ports, and exhibiting extraordinary magnetoresistance comprising:

calculating the extraordinary magnetoresistance using finite element analysis as a function of an applied magnetic field and the geometry of the device;

calculating the field-dependence of a current flow and the potential of the device;

comparing the extraordinary magnetoresistance, the field-dependence of a current flow and the potential of the device to predetermined qualities; and modifying the material properties and device geometry to obtain a correlation between the calculations and the predetermined qualities, wherein:

boundry conditions are applied directly to specific sections of the geometry of the device while self-consistently determining the values of the potential at other sections of the geometry from a discretized action integral; and the potential valued at all current ports are equated to each other.

2. A method for optimizing as in claim 1 further comprising:

using a bandwidth reducer and sparse matrix LU solver for reducing the time required for calculating.

3. A method for optimizing the design of a magnetoresistance van der Pauw sensor comprised of a semiconductor substrate, semiconductor material in the form of a closed contour having an area Aa disposed on the substrate, and a conducting material having an area Ab disposed at least partially within said semiconductor material to form a conducting inhomogeneity, whereby the ratio of the area Aa to the area Ab is selected to maximize the magnetoresistance of the sensor at approximately room temperature comprising:

applying a current to a first port and providing for the current to exit via a second port;

measuring the response of the semiconducting contour by the difference in voltage at a third and fourth port with widths Δ3 and Δ4 consecutively;

discretizing the action integral that gives rise to the differentiated equation for the electrostatic potential of the contour;

implementing a variational principle;

equating all nodal values for nodes in the third and fourth ports for defining a unique potential at the third and fourth ports over widths Δ3 and Δ4;

calculating the effective resistance;

calculating the enhanced magnetoresistance;

modifying the geometry and material properties of the sensor to correlate its magnetoresistance properties to predetermined magnetoresistance properties.

4. A method for optimizing as in claim 3 wherein:

the discretizing is preformed using an unstructured triangular mesh generated by an algebraic integer method.

5. A method for optimizing as in claim 4 wherein:

the triangular mesh is selectively increased in density in regions representing large changes in current distribution.

6. A method for optimizing as in claim 3 wherein:

the variational principle is implemented by varying the discretizing action with respect to nodal variables.

7. A system for designing a semiconductor thin film device with at least one metallic inclusion therein exhibiting enhanced magnetoresistance comprising:

software for selectively meshing the geometric structure of the device with mesh density increasing in regions of the geometry representing large changes in current distribution;

software for obtaining a coefficient matrix from the connoctivity of the mesh;

software for calculating a finite element result from the matrix accounting for the material properties and geometric structure of the device; and a hardware system for implementing the software, wherein:

a bandwidth reducer is used on the matrix and then it is decomposed into the standard LU form for Gaussian elimination.

* * * * *